United States Patent [19]

Koike et al.

[11] 4,242,694

[45] Dec. 30, 1980

[54] SOLID-STATE COLOR IMAGING DEVICE

[75] Inventors: Norio Koike, Tokyo; Masaharu Kubo, Hachioji, both of Japan

[73] Assignee: Hitachi, Ltd., Japan

[21] Appl. No.: 832,676

[22] Filed: Sep. 12, 1977

[30] Foreign Application Priority Data

Sep. 13, 1976 [JP] Japan .................. 51-108785

[51] Int. Cl.³ ................ H01L 27/14; H01L 31/00; H01L 29/78; H04N 9/07
[52] U.S. Cl. ................ 357/30; 357/24; 357/59; 358/44
[58] Field of Search ............ 357/24, 30; 358/44; 250/211 J

[56] References Cited

U.S. PATENT DOCUMENTS

| | | | |
|---|---|---|---|
| 3,856,989 | 12/1974 | Weimer | 357/24 |
| 4,001,878 | 1/1977 | Weimer | 357/24 |
| 4,064,532 | 12/1977 | Yamanaka | 357/24 |
| 4,143,389 | 3/1979 | Koike et al. | 357/24 |

*Primary Examiner*—Gene M. Munson
*Attorney, Agent, or Firm*—Craig & Antonelli

[57] ABSTRACT

A solid-state color imaging device contains semiconductive photoelectric elements for light of the respective primary colors, and means for sequentially transmitting charges as electric signals, the charges having been generated and stored according to the quantities of the corresponding primary color light beams received by the photoelectric elements. Transparent conductive films are provided through transparent insulating films on the light receiving sides of the photoelectric elements for at least two primary color light beams, and the charge storage capacitances of the respective photoelectric elements or the ratios of the quantities of light actually reaching photoelectric transduction portions to the entering quantities of the corresponding primary color light beam in the respective photoelectric elements are set at predetermined values.

22 Claims, 14 Drawing Figures

SOLID-STATE COLOR IMAGING DEVICE

BACKGROUND OF THE INVENTION

1. Field of the Invention

This invention relates to a solid-state image pickup device for color pictures, and more particularly to a solid-state color imaging device in which the signal-to-noise ratios and the resolving powers for the respective primary colors are high.

2. Description of the Prior Art

Desiredly, a solid-state imaging device is should have the same extent of resolving power as that of an image pickup tube presently under use for television broadcasting. Even for the monochrome image pickup, an array of 500×500 photoelectric elements, switches for X-Y addressing these elements, and X- and Y-scanners which serve to turn the switches "on" and "off" and each of which consists of 500 stages are necessary. On the other hand, the chip size of a solid-state imaging device IC is limted from the aspects of manufacturing techniques and materials. Accordingly, a solid-state imaging device is usually fabricated through silicon MOS IC technology which can achieve a high integration density. In the case of the MOS structure, the source junction of a MOS field effect transistor (hereinafter, abbreviated to "MOST"), which is used as a switch at the time when charges stored in the photoelectric device are transmitted as a picture signal in response to a scanning pulse, can be utilized as a photodiode. This brings forth the great advantage that the photoelectric device and the switch can be fabricated integrally. In addition, the yield of fabrication is high. A photoelectric device employing silicon as the parent material, however, exhibits a low sensitivity in visible light and has the following serious problems as the photoelectric device for color image pickup:

(a) The optical absorption edge of silicon lies at 9,000 Å in terms of wavelength, and the sensitivity thereof in the infrared region is high. However, the photosensitivity of silicon in the visible region (4,500 Å-6,600 Å), especially the blue region (4,500 Å), necessary for the ordinary image pickup is conspicuously low. The present inventors fabricated for test purposes a three-plate type color camera which employed three solid-state imaging devices of the silicon MOS structure for the colors blue (4,500 Å), green (5,500 Å) and red (6,600 Å), respectively. As a result, it was revealed that the sensitivity of the imaging device for blue light is about 1/5 of the sensitivity of the highly sensitive imaging device for red light and that the sensitivity of the imaging device for green light is about ⅔ of the sensitivity of the imaging device for red light. Charges created by light are stored in the junction capacitances of the photodiodes, and are read out at a predetermined period (30 Hz in the NTSC system). Where charges for charging up the capacitance are stored in the photodiode for red light, signal charges are stored in an amount of only ⅔ of the capacitance in the photodiode for green light and in an amount of only 1/5 of the capacitance in the photodiode for blue light. Accordingly, the signal-to-noise ratio of the device for blue light is very low and sometimes becomes a serious hindrance to practical use. On the other hand, when the enhancement of the signal-to-noise ratio is intended in such a way that signal charges charge up the diode capacitance in the device for blue light, charges corresponding to four times the diode capacitance cannot be accommodated in the diode capacitance in the device for red light and double the charges cannot be accomodated in the diode capacitance in the device for green light. Therefore, they overflow to the surrounding material, and degradations of the resolving powers are incurred in the devices for red light and for blue light.

(b) Light of longer wavelengths than red light, i.e., infrared radiation, also enters to create unnecessary charges. Since the absorption coefficient of silicon for infrared radiation is small, infrared radiation penetrates deep into the silicon substrate. The charges generated there diffuse, not only into the diode at the position of incidence, but also into the surrounding diodes, which causes a lowering of the resolving power as stated at the end of Item (a).

In the case where the separate imaging devices for the respective three primary colors are employed as described above, an optical system needs to be separated to some extent for the respective three primary colors. This renders the apparatus large-sized. In addition, a difficult operation of aligning the three imaging devices is required in order to exactly register images of the three primary colors, and the whole camera inevitably becomes expensive.

SUMMARY OF THE INVENTION

An object of this invention is to provide a solid-state color imaging device which is free from the disadvantages of the prior-art solid-state imaging devices as described previously, with which a color camera can be fabricated from only one solid-state imaging device and which offers color pictures of high signal-to-noise ratio and resolving power.

In order to accomplish the object, according to this invention, the image of an object is separated into color components by optical filters, photoelectric elements for the color components are endowed with signal charge storage capacitances suitable for quantum efficiencies (sensitivities) for the respective colors, and further, the unnecessary incidence of infrared radiation is prevented. Concretely, the ratio among the charge storage capacitances of, e.g., photoelectric elements for red, green and blue is made approximately 5:3:1. Alternatively, in this invention, semitransparent conductive films which are provided through transparent insulating films on the light receiving sides of photoelectric elements are used as filters which adjust for the respective photoelectric elements the quantities of light of the respective color components reaching photodiodes actually carrying out the photoelectric transduction, and by way of example, the thickness of the transparent conductive film is made large for the red element and small for the blue element so that the total quantities of charges to be generated during one frame period in the elements for the respective primary colors may become equal.

Further, a plurality of sets of such photoelectric elements for the respective color components are arrayed in the shape of stripes or a checkered pattern on the same semiconductor substrate, thereby making it possible to perform the color image pickup with the single solid-state imaging device.

DESCRIPTION OF THE PREFERRED EMBODIMENTS

1. Embodiment 1

Figure 1A:
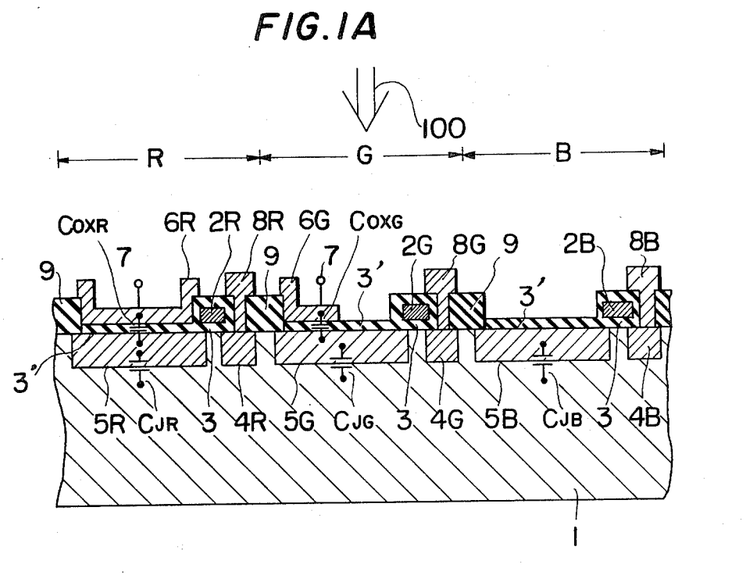
FIG. 1A is a sectional view of a solid-state color imaging device according to a first embodiment of this invention.
Figure 1B:
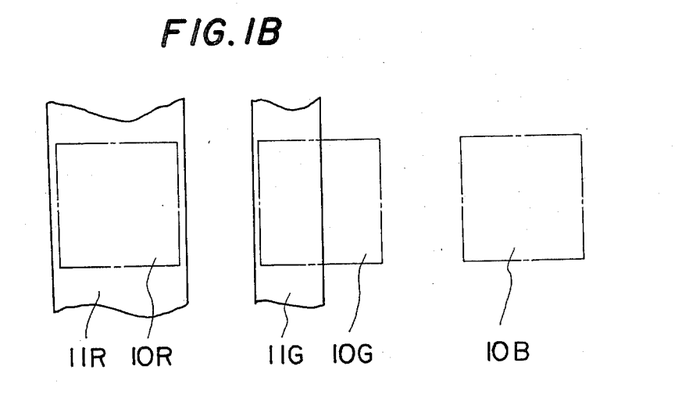
FIG. 1B is a view for explaining the plan pattern of the solid-state color imaging device according to the first embodiment of this invention.
Figure 1C:
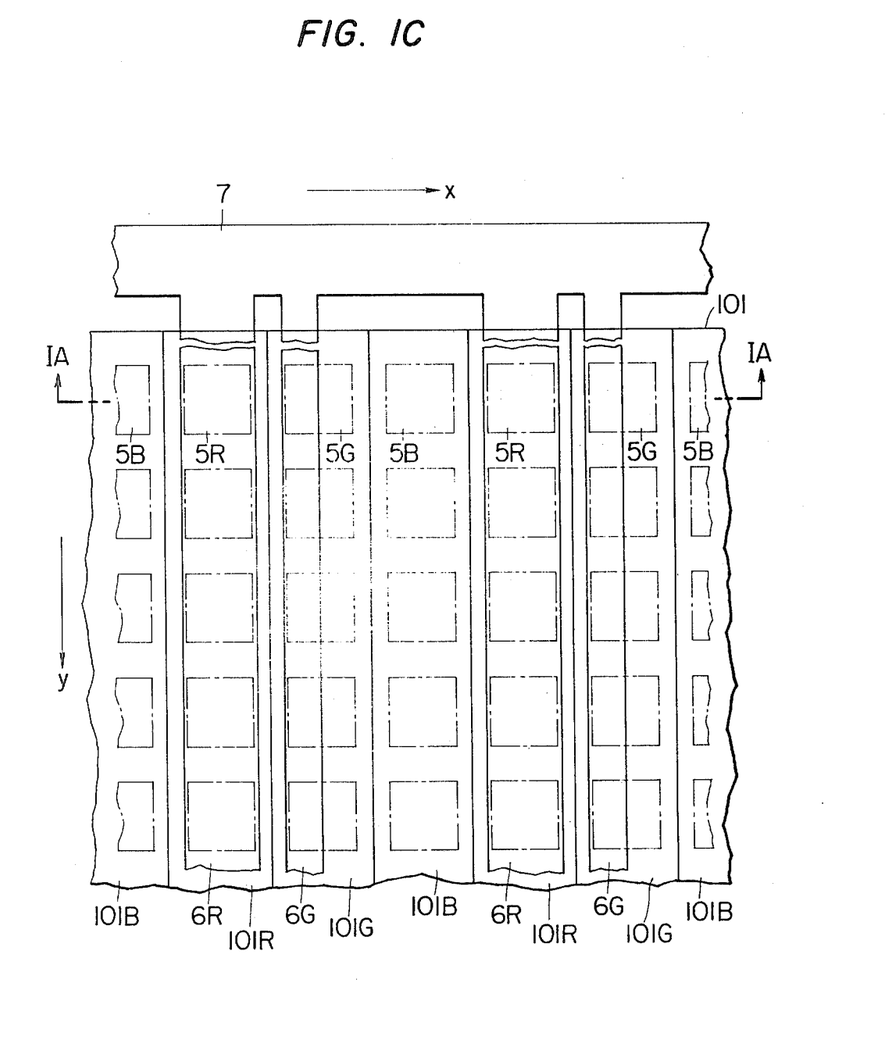
FIG. 1C is a plan view of the solid-state color imaging device according to the first embodiment of this invention.

FIGS. 1A–1H are views of a solid-state imaging device according to a first embodiment of this invention, among which FIG. 1A is a sectional structural view, FIG. 1B is a plan pattern view, FIG. 1C is a plan view showing the general construction, and FIGS. 1D–1H are sectional views showing the manufacturing process. FIG. 1A shows a section taken along IA—IA in FIG. 1C. In the figure, numeral 1 designates a silicon semiconductor substrate of a first conductivity type (for example, n-type) into which elements are integrated. Numeral 100 denotes incident light. Regions R, G and B form the photoelectric elements allotted for red, green and blue, respectively. These three elements constitute a unit or set, and such elements are arrayed regularly in the form of a matrix. Although omitted in FIG. 1A, an optical filter 101 for separating the image of an object into respective color components (in this embodiment, the three primary colors of red, green and blue) is provided by bonding or the like on the side of the incident light 100 in this device as illustrated in FIG. 1C. Light beams of the separated color components impinge upon to the corresponding photoelectric elements. The optical filter 101 consists of a striped color filter element for red light 101R, a striped color filter element for green light 101G, and a striped color filter element for blue light 101B. In each photoelectric element, 2R, 2G or 2B indicates a gate electrode which is provided through an insulating film 3; 4R, 4G or 4B a drain which is formed of an impurity-doped layer of a second conductivity type (for example, p-type) opposite to that of the substrate; and 5R, 5G or 5B a source which is formed of an impurity-doped layer of the second conductivity type. A junction (for example, p-n junction) which each source region defines between it and the substrate is used as a photodiode for photoelectric transduction (since the source junction serves also as the photodiode junction and there is no likelihood of confusion, the source and the photodiode will hereinafter be represented by the same symbol). The source 5R functions as the photodiode for red light, 5G as the photodiode for green light, and 5B as the photodiode for blue light. 6R and 6G represent transparent conductive films which are provided on insulating films 3' so as to fully or partially cover the photodiode, and the transparent conductive film 6R is used for red light and that 6G for green light. In the present embodiment, a conductive film for blue light is not provided for a reason to be described later. The conductive films 6R and 6G have a voltage (which may be, for example, the ground potential of zero V) commonly applied thereto from a terminal 7, and are fixed to the predetermined voltage. 8R, 8G and 8B indicate signal output lines which lie in contact with the drains 4R, 4G and 4B, respectively. When scanning pulses are impressed on the gate electrodes 2R, 2G and 2B, charges having been stored in the diodes 5R, 5G and 5B are transmitted as signals representative of the quantities of light by the signal output lines 8R, 8G and 8B, respectively. Shown at 9 is a field insulating oxide film for isolation between the photoelectric elements. The imaging device of the structure thus far described can be simply fabricated by adding the process of forming the conductive films to the well-known MOS fabrication process. FIG. 1B is a plan pattern view of the photoelectric elements the sectional structures of which are illustrated in FIG. 1A. 10R, 10G and 10B denote the layout patterns of the photodiodes, while 11R and 11G indicate the layout patterns of the conductive films. FIG. 1C is a plan view showing the general construction, in which the constituent units each consisting of the regions R, G and B illustrated in FIGS. 1A and 1B are arranged in two-dimensional directions x and y. Since the photodiodes are isolated from one another by the thick insulating films 9, the conductive films 6R and 6G covering the photodiodes need not be isolated at every diode but they may be put together into stripes. In addition, the conductive films arranged in the shape of the stripes are connected with one another, and one end of such an integral conductive film becomes the terminal 7 to which the voltage is applied.

The photoelectric elements according to this invention will be further described. The sources 5R, 5G and 5B define the junction type diodes between them and the substrate, and the respective diodes for red, green and blue light have junction capacitances $C_{JR}$, $C_{JG}$ and $C_{JB}$. These capacitances have an identical capacitance value $C_J$ ($C_{JR} = C_{JG} = C_{JB} = C_J$) because the junction areas, i.e., the layout pattern areas of the respective diodes shown in FIG. 1B are equal. Since the conductive films 6R and 6G are fixed at the predetermined voltage, they define insulating film capacitances $C_{OX}$ between them and the sources 5R and 5G, respectively, and the conductive film for red light 6R has a capacitance value $C_{OXR}$, while the conductive film for green light 6G a capacitance value $C_{OXG}$. The respective capacitance values $C_{OXR}$ and $C_{OXG}$ are determined by the thickness $d_{OX}$ and dielectric constant $\epsilon_{OX}$ of the insulating films and the overlapping areas $S_R$ (for red) and $S_G$ (for green) between the conductive films and the diodes, and they are given by the following equations:

$$C_{OXR} = \frac{\epsilon_{OX} \cdot S_R}{d_{OX}} \tag{1}$$

$$C_{OXG} = \frac{\epsilon_{OX} \cdot S_G}{d_{OX}} \tag{2}$$

Accordingly, the total capacitance which each photoelectric element has becomes the sum between the junction capacitance $C_J$ and the insulating film capacitance $C_{OX}$, and the capacitances $C_R$, $C_G$ and $C_B$ of the respective photoelectric elements for red, green and blue light are represented by the following equations:

$$C_R = C_{OXR} + C_J \quad (3)$$

$$C_G = C_{OXG} + C_J \quad (4)$$

$$C_B = C_J \quad (5)$$

The junction capacitance $C_J$ is, in general, smaller than the insulating film capacitance $C_{OX}$ though it depends also on the impurity concentration of the substrate used. In case of a semiconductor substrate having an impurity concentration of $10^{15}/cm^3$ and an insulating film thickness $d_{OX} = 1,000$ Å as are most commonly used in the MOS fabrication process, the junction capacitance $C_J$ becomes $\frac{1}{4}$ of the insulating film capacitance $C_{OX}$, provided that the latter capacitance $C_{OX}$ is of the value at the time when the conductive film 6 is provided over the entire area of the photodiode, i.e., it is the capacitance $C_{OXR}$. When the overlapping area for green light is made a half of that for red light as illustrated in FIGS. 1B and 1C, the capacitance ratio among the photoelectric elements becomes $C_R:C_G:C_B = 5:3:1$. This ratio is equal to the ratio among the photosensitivities of the photoelectric elements for red, green and blue light which are fabricated by using silicon for the substrate. As a result, the quantities of light which charge up the storage capacitances of the photoelectric elements for the respective colors with charges can be made equal for all the three elements for red, green and blue light. Thus, there can be solved the problems of the low signal-to-noise ratio attributed to the fact that the charges are too small in quantity with respect to the storage capacitance, and the degradation of the resolving power attributed to the fact that the storage capacitance is too small with respect to the total amount of charges generated, so the charges overflow to the surroundings. Another great advantage brought forth is that the system design of the camera becomes very simple. Whether the aforecited conductive film is a conductive transparent film of $SnO_2$, $In_2O_3$ or the like, or a semitransparent film constructed of a metallic thin film of Au, Al, Cr or the like, it is effective for the increase of the capacitance. Further, when a material which absorbs infrared radiation is employed, the conductive film can function also as a filter for the infrared radiation absorption which is unnecessary for the color image pickup and which causes the degradation of the resolving power as stated previously. When polycrystalline silicon often used in the fabrication of a semiconductor integrated circuit is employed as the material of the conductive film, no problem in fabrication occurs owing to its suitability to the MOS integrated circuit. Moreover, it absorbs infrared radiation, so that the conductive film serves also as an infrared filter. The quantity of absorption as the filter can be controlled to a required value by the film thickness of polycrystalline silicon. Since charges created in the film due to the infrared radiation are normally absorbed by the applied voltage, the conductive film is always fixed at the applied voltage, and no problem takes place.

In the above description, in order to avoid complicacy of the explanation, there has been explained the simplest construction, i.e., an example in which the photoelectric elements for red, green and blue light are arrayed in the form of stripes. As is well known, however, an array corresponding to a checkered pattern etc. ought to be considered. In such a case, the technology of this invention may be applied to photoelectric elements for the respective colors. In the above, it has been described that the three primary colors are employed as the color components separated by an optical filter. However, it is also possible to employ complementary colors (cyan, magenta and yellow) to the three primary colors. In the case of employing the complementary colors as the color components, cyan may be substituted for blue, magenta for green, and yellow for red. These points are similarly applicable to Embodiments 2–6 to be stated later.

Now, the manufacturing process of the solid-state imaging device with the structure of the present embodiment will be described with reference to FIGS. 1D–1H. The manufacturing method is one in the case of adopting the LOCOS (local oxidation of silicon) which is especially high in the density of integration among the manufacturing techniques of MOST's. It is to be noted that the device of this invention is not restricted to the particular method of manufacture. For the sake of convenience of the explanation, the manufacturing steps of only the portion of the photoelectric element for red light are illustrated.

Figure 1D:
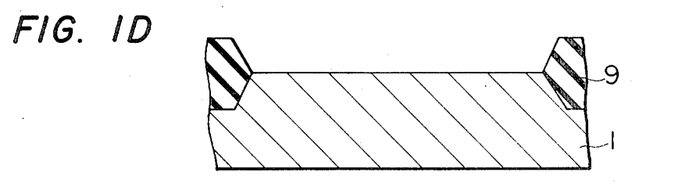
FIGS. 1D–1H are sectional views of the solid-state color imaging device at various steps of manufacture for explaining the manufacturing process of the device according to the first embodiment of this invention.

(i) A first oxide film 9 is formed on a substrate 1 by the LOCOS process (FIG. 1D).

Figure 1E:
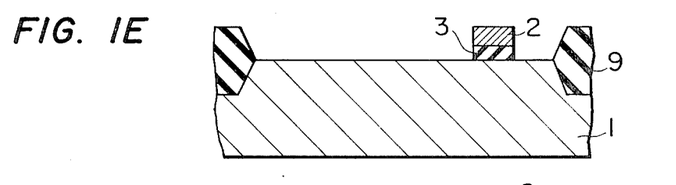

(ii) An oxide film for a gate 3 is formed by the thermal oxidation, and a polycrystalline silicon layer 2 for a gate electrode is deposited thereon by, for example, the CVD (chemical vapor deposition) process. Further, the polycrystalline silicon layer other than a portion corresponding to a gate region is removed by the photoetching method, and using the resultant gate electrode as a mask, the gate oxide film outside the gate electrode is removed by etching (FIG. 1E).

Figure 1F:
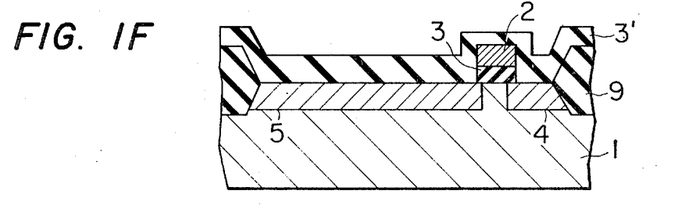

(iii) An impurity of the conductivity type opposite to that of the substrate is diffused by the thermal diffusion, to form a drain 4 and a source 5 (photodiode). The impurity simultaneously diffuses into the polycrystalline silicon layer for the gate, to raise the conductivity of the polycrystalline silicon layer. Thereafter, a second oxide film 3' is formed over the entire surface (FIG. 1F).

Figure 1G:
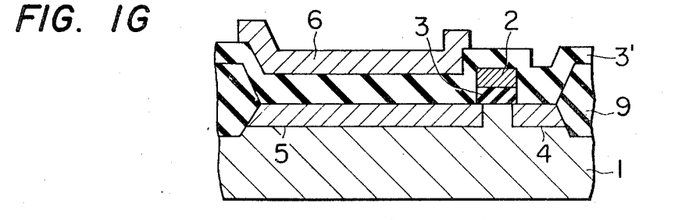

(iv) An $SnO_2$ or $In_2O_3$ film being, for example, 5000 Å–10000 Å thick; polycrystalline silicon layer being, for example, 2000 Å–5000 Å thick; or a metallic thin film being, for example, 300 Å–3000 Å thick is provided on the second oxide film by, for example, evaporation. Subsequently, the film or material is removed so as to leave its region overlying the photodiode, thereby to make an electrode 6 for forming the oxide film capacitance $C_{OX}$. Here, in the case of employing the polycrystalline silicon for the electrode, it should be doped with an impurity of the opposite conductivity type to that of the substrate either by the diffusion process or by the ion implantation process in order to enhance the conductivity of the material (FIG. 1G).

Figure 1H:
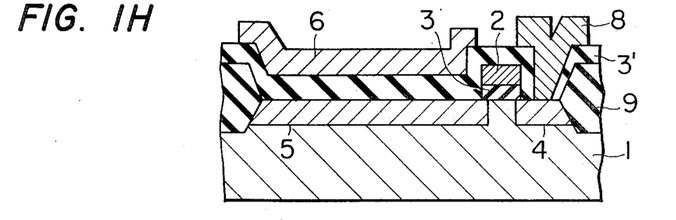

(v) The second oxide films overlying the drain are removed by photoetching, and an Al film is deposited over the entire surface by evaporation. Thereafter, the Al film except for a wiring portion for signal output 8 is removed by photoetching. Then, the fabrication of the device is completed (FIG. 1H). Scanning circuits arranged in the peripheral part with respect to the photoelectric elements are also fabricated by the steps illustrated in FIGS. 1D–1H (the illustration has been omitted).

For the fabrication of the photoelectric element for green light G, a prior-art etching treatment may be performed in the above step (iv) so as to form an electrode of predetermined area. Further, for the fabrication of the photoelectric element for blue light B, an etching treatment for fully removing the conductive film formed in the corresponding element region may be carried out.

2. Embodiment 2

Figure 2:
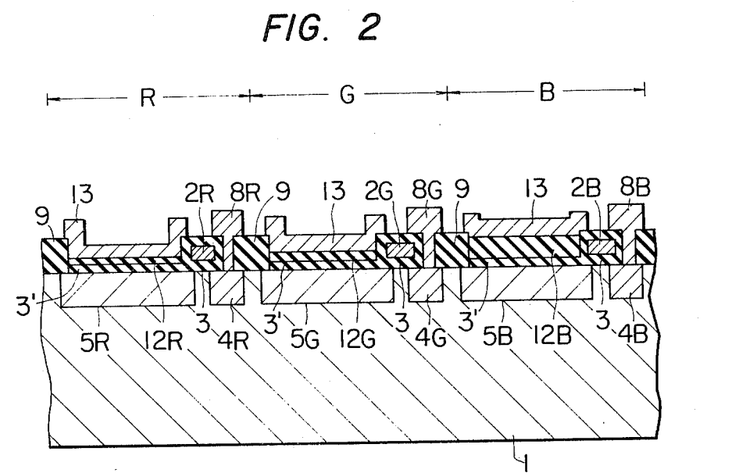
FIGS. 2, 3 and 4 show sectional views of solid-state color imaging devices according to second, third and fourth embodiments of this invention, respectively.

FIG. 2 is a sectional view which shows a solid-state imaging device according to a second embodiment of this invention. In the figure, the optical filter is omitted from the illustration. In the present embodiment, the areas of the conductive films formed for increasing the storage capacitances are equal for all the photoelectric elements for red, green and blue light, whereas the thicknesses of the insulating films underlying the conductive films are different for the elements for the respective primary colors. 12R, 12G and 12B designate insulating films the respective thicknesses of which are varied in dependence on the light colors of the photoelectric elements. Numeral 13 indicates conductive film of light-permeable property (covering transparent and semitransparent natures) as is provided through the insulating oxide film 12. The other symbols are the same as in FIGS. 1A through 1H. Here will be given an example for rendering the storage capacitances of the photoelectric elements for the respective primary colors proportional to the photosensitivities of the respective elements. In the case where a silicon oxide ($SiO_2$) film is employed as the insulating film and where the thickness of the oxide film 12B of the element for blue light is selected at 5,000 Å, it is understood from Eqs. (3), (4) and (5) that the thickness of the oxide film 12G of the element for green light may be selected at 1,600 Å and that the thickness of the oxide film 12R of the element for red light may be selected at 1,000 Å. In general, the silicon oxide ($SiO_2$) film is employed as the insulating film. The processing precision of $SiO_2$ is the highest among MOS fabricating techniques, and the dispersion in the thickness of the film is on the order of 20 Å. Accordingly, even in the case where the film thickness is 1,000 Å, the dispersion is 2%, and the ratio of the storage capacitances can be accurately controlled. If a still higher precision is desired, the thicknesses of the oxide films may be made greater as, for example, 10,000 Å for blue light, 3,300 Å for green light and 1,800 Å for red light.

3. Embodiment 3

Figure 3:
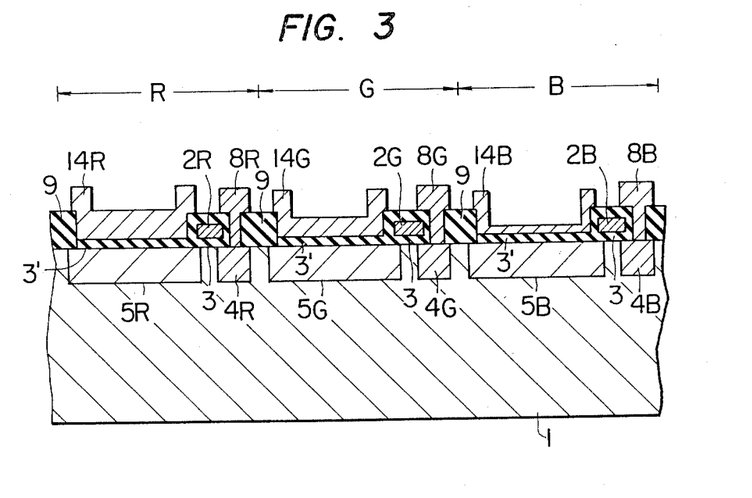

FIG. 3 is a sectional view which shows a solid-state imaging device according to a third embodiment of this invention. In the figure, the optical filter is omitted. In the present embodiment, a semitransparent material is selected for the conductive film to be provided over the photodiode region, and the thicknesses of the semitransparent conductive films are varied for the respective photoelectric elements for red, green and blue light so that the ratio of light quantities actually reaching the photodiodes in light quantities entering the elements may become different for the respective colors. 14R, 14G and 14B indicate semitransparent conductive films which are provided through insulating films 3' so as to cover the entire areas of photodiodes for red, green and blue light, respectively. These conductive films 14R, 14G and 14B are made thinner in the order mentioned. In this way, it is possible to make the largest the quantity of light which is absorbed by the conductive film 14R and to make the smallest the quantity of light which reaches the photodiode for red light 5R exhibiting the highest sensitivity. Conversely, the quantity of light which reaches the photodiode for blue light 5B exhibiting the lowest sensitivity becomes the largest. As a result, the quantities of charges to be generated in the respective photodiodes for red light, green light and blue light within one frame period can be made equal. There will be given an example in the case where polycrystalline silicon suitable for the fabrication of a MOS integrated circuit is employed for the semitransparent conductive film. Since the absorption coefficients for red light (6,600 Å), green light (5,500 Å) and blue light (4,500 Å) are $4 \times 10^3$ cm$^{-1}$, $6 \times 10^3$ cm$^{-1}$ and $2 \times 10^4$ cm$^{-1}$ respectively (according to W. C. Dash et al., Physical Review 99, 1151 (1955)), the film thicknesses may be set at 5,000 Å for red light, 3,300 Å for green light and 1,000 Å for blue light.

4. Embodiment 4

Figure 4:
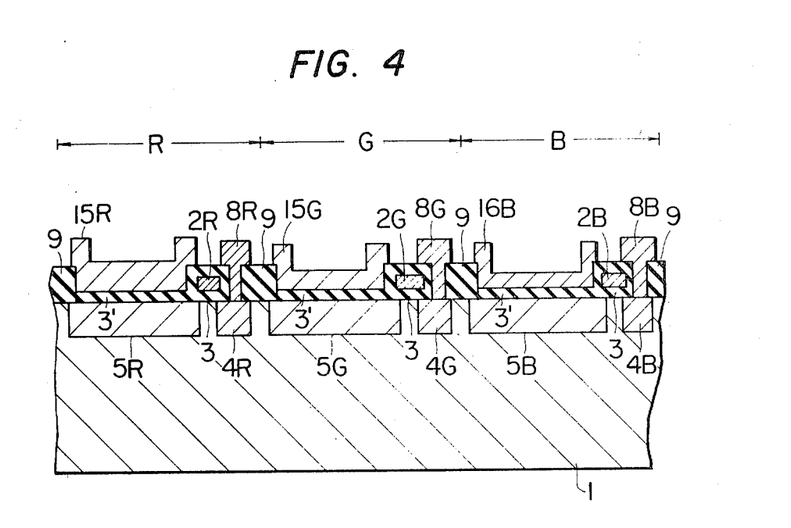

FIG. 4 is a sectional view which shows a solid-state imaging device according to a fourth embodiment of this invention. In the figure, the optical filter is omitted. In the present embodiment, the conductive film 16B of the photoelectric element for blue light exhibiting the lowest sensitivity is made a transparent film of any desired thickness by employing, for example, tin oxide. Since the tin oxide film is a practically transparent one, the thickness of the film can be selected as desired. For the elements for red light and green light exhibiting good sensitivities, semitransparent conductive films 15R and 15G are respectively employed as in the third embodiment. The thickness of the film 15G is made about 60% of that of the film 15R as in the third embodiment.

By way of example, polysilicon at 40,000 Å is used as the film 15R, and polysilicon at 20,000 Å as the film 15G.

5. Embodiment 5

Figure 5:
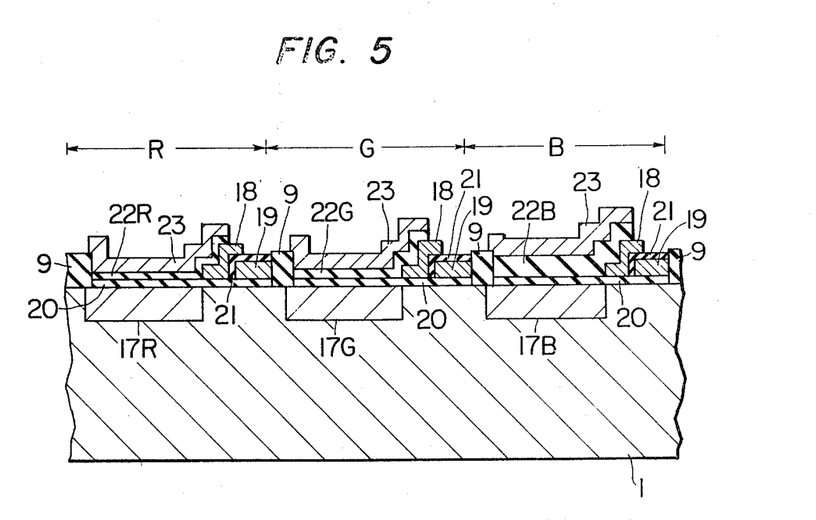
FIGS. 5 and 6 show sectional views of a solid-state imaging device according to a fifth embodiment of this invention as employs a CTD for a signal charge transferring portion.
Figure 6:
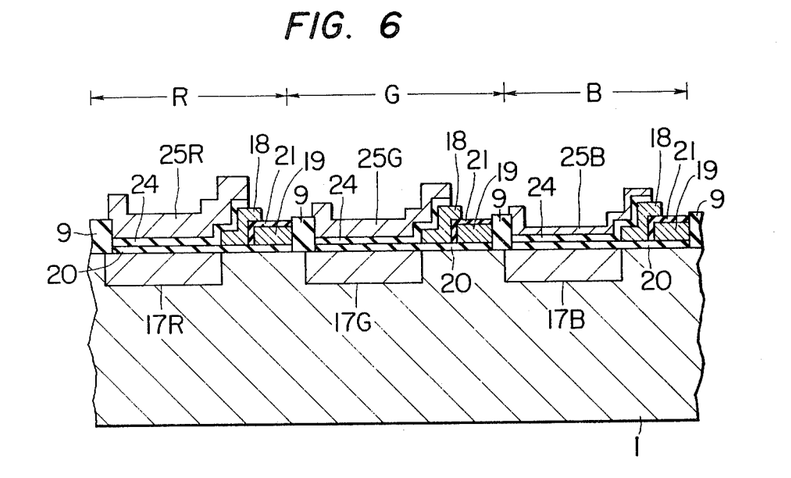

Although, in any of the foregoing embodiments, a MOST is employed as means for transmitting signal charges, it is possible to employ as the means a charge transmitting device which can also be fabricated by the MOS integrated circuit technology, for example, a CTD (charge transfer device). FIGS. 5 and 6 are views for elucidating an embodiment in which this invention is applied for color image pickup to a CCD (charge coupled device) solid-state imaging device of the line address system (M. F. Tompsett et al., "Charge-coupling improves its image, Challenging video camera tubes," Electronics, Jan. 18, pp, 162-169 1973). In FIGS. 5 and 6, the optical filter is omitted. Likewise to the cases of the other embodiments already described, letters R, G and B designate photoelectric elements for red, green and blue light which are regularly arrayed. 17R, 17G and 17B indicate photodiodes. Numeral 18 indicates a switching gate electrode by which light signal charges stored in the photodiode are fed into a signal transferring CCD electrode 19. The electrodes 18, 19 and the substrate 1 are insulated by an insulating oxide film 20, while the electrodes 18 and 19 are insulated by an insulating oxide film 21. These two examples are the same as the other embodiments already stated in that charges are created and stored in the photodiodes in proportion to the quantities of light received thereat. They differ in that the stored charges are not transferred by conduction in a conductor but are transferred by the well-known CCD system successively from a potential well to another in a semiconductor by the use of a multiphase pulse voltage which is synchronized with scan pulses impressed on the transfer electrodes 19 arrayed in large numbers along charge transfer paths arranged normally to the drawing and which is high in frequency. In the example of the fifth embodiment shown in FIGS. 5, 22R, 22G and 22B designate insulating oxide films of $SiO_2$ or the like for the elements for red, green and blue light, respectively, which films become thicker in the order mentioned. Light-permeable conductive films (for example, $SnO_2$ films) 23 have equal thicknesses. According to the present embodiment, as in the second embodiment, the oxide film capacitance values $C_{OX}$ to be added to the junction capacitance value $C_J$ are made different for the respective colors so that the capacitance values $C_R$, $C_G$ and $C_B$ of the respective photoelectric elements for red, green and blue light may correspond to the sensitivities of the elements for respective color light beam. Accordingly, the thicknesses of the oxide ($SiO_2$) films 22R, 22G and 22B may be made 1,000 Å, 1,600 Å and 5,000 Å, respectively. In the example shown in FIG. 6, as in the third embodiment, the thicknesses of semitransparent conductive films are made different for the respective colors, and the ratios of the quantities of light actually reaching photodiodes in the quantity of entering light are made different so as to compensate for quantum efficiencies in the photodiodes varying for the respective colors. Accordingly, the thicknesses of conductive films for red, green and blue light 25R, 25G and 25B which are provided through insulating oxide films 24 of $SiO_2$ or the like and which employ semitransparent polycrystalline silicon may be made 5,000 Å, 3,300 Å and 1,000 Å, respectively, as in the third embodiment. The above examples can be fabricated by manufacturing steps similar to those of the first to fourth embodiments.

6. Embodiment 6

Figure 7:
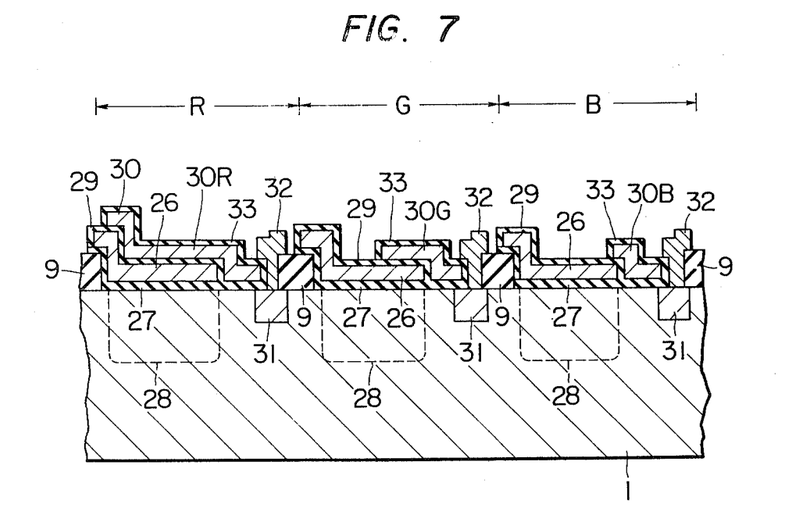
FIG. 7 shows a sectional view of a solid-state imaging device according to a sixth embodiment of this invention.

In the first to fifth embodiments already stated, a photodiode is employed for the photoelectric transduction. Instead of a photodiode, there may be exploited the fact that charges are induced by light in a depletion layer which is formed in the surface of a semiconductor substrate. FIG. 7 is a sectional view showing a sixth embodiment according to such a measure. In FIG. 7, the optical filter is omitted. In the figure, numeral 26 represents a light-permeable conductive film which is provided on a semiconductor substrate 1 through an insulating oxide film 27 of $SiO_2$ or the like. When a voltage (which may generally be 5-10 V) greater than the threshold voltage of a MOS transistor is applied to the conductive film 26, a depletion layer 28 which is several μm deep is formed in the surface of the Si semiconductor substrate 1. Numeral 30 denotes a light-permeable gate electrode which is provided on the light-permeable conductive film 26 through an insulating oxide film 29 of $SiO_2$ or the like. It transmits light signal charges generated in the depletion layer 28 during one frame period, to a drain 31 joining to a signal output line 32 by a scanning pulse. Shown at 33 is an insulating oxide film of $SiO_2$ or the like for insulating the gate electrode 30 and the signal output line 32. Simultaneously with the function of the charge transmission, the gate electrode 30 serves to adjust the quantities of light reaching photoelectric transduction portions for red, green and blue light so as to make equal the total quantities of charges to be generated in the photoelectric elements for the respective colors during one frame period. The gate electrode or red light 30R covers the entire region of the depletion layer 28, the gate electrode for green 30G covers a part of the depletion layer 28, and the gate electrode for blue 30B lies only in a region necessary for effecting the gate action and does not overly the depletion layer 28 at all. The areal ratio of the depletion layer regions to be covered by the gate electrodes 30 varies depending upon the thickness and material of the underlying light-permeable conductive films 26. It may be set so that the quantities of light entering the depletion layers 28 through the two sorts of light-permeable conductive films 30 and 26 may be inversely proportional to the color photosensitivities of the photoelectric elements for the respective colors, R, G and B. The structure of the present embodiment can be fabricated by reversing the order of formation of the gate electrodes and the light-permeable conductive films in the fabricating process of the first embodiment. It can be simply fabricated in such a way that, after forming the light-permeable conductive film 26, the insulating oxide films 29 are deposited thereon, the gate electrodes 30 being further formed.

As set forth above, according to this invention, at least one of the charge storage capacitances of the photoelectric elements for two or more color components into which the image of an object is separated by the optical filter and the ratio of the quantities of lights actually reaching the photoelectric transduction portions in the quantity of entering light is controlled, whereby the charge storage capacitances of the photoelectric elements for the respective colors can be made values matching with the color photosensitivities of the respective elements. As a result, the ranges of the detecting quantities of light for the respective colors become equal. In the case of the separation into, for example, the three primary colors, there can be prevented both the drawback that the signal-to-noise ratio decreases on account of too little charges created with respect to the capacitance for blue light and the drawback that the resolving power degrades on account of the overflow of excess charges created with respect to the capacitance for red light or the diffusion of charges ascribable to infrared radiation reaching deep in the interior. Thus, a solid-state color imaging device of high signal-to-noise ratio and high resolving power is provided.

A bipolar transistor and a junction type field effect transistor can also be utilized as the signal charge transmitting means.

What is claimed is:

1. A solid-state color imaging device comprising a semiconductor body of a first conductivity type having a major surface portion and three sets of photoelectric elements corresponding to a first, a second, and a third primary color of light, wherein said first color of light is long wavelength light, said second color of light is middle wavelength light, and said third color of light is short wavelength light, respectively, disposed in said major surface portion such that each of said sets corresponding to a respective color component is separated by an optical filter, a respective photoelectric element being comprised of:
   (a) a field-effect transistor having a source region and a drain region of a second conducitvity type opposite to said first conductivity type, a gate insulating film provided so as to cover a region lying between said source region and said drain region, and a gate electrode provided on said gate insulating film, one of said source region and said drain region constituting with said substrate a photodiode;

(b) a transparent insulating film which is provided so as to cover said photodiode; and (c) a transparent electrode provided on the transparent insulating films of two sets of said photoelectric elements of said three sets wherein the transparent electrode of the photoelectric element for said first light covers over its respective photodiode, the transparent electrode of the photoelectric element for said second light covers a part of its respective photodiode, and the photoelectric element for said third light is not covered by transparent electrode, permitting at least part of the incident light to permeate therethrough, being held at a predetermined voltage, and forming an electrostatic capacitance together with said body.

2. A solid-state color imaging device comprising a semiconductor body of a first conductivity type having a major surface portion and three sets of photoelectric elements disposed in said major surface portion of said body wherein each respective set corresponds to each of a first, a second, and a third primary color of light, wherein said first color of light is long wavelength light, said second color of light is middle wavelength light, and said third color of light is short wavelength light, respectively, each respective photoelectric element being comprised of:

(a) a field-effect transistor having a region of a second conductivity type opposite to said first conductivity type constituting a photodiode, a gate insulating film provided so as to cover a region adjacent to said region of a second conductivity type, a gate electrode provided on said gate insulating film, a region for transferring charges being adjacent to said region covered with said gate electrode, and functioning as the field-effect transistor together with said region of a second conductivity type and said gate electrode, and a transfer-electrode provided so as to cover said region for transferring charges;

(b) a transparent insulating film which is provided so as to cover said photodiode; and (c) a transparent electrode provided on two sets of said three sets of transparent insulating films of said photoelectric elements wherein the transparent electrode of the photoelectric element for said first light covers over its respective photodiode, the transparent electrode of the photoelectric element for said second light covers a part of its respective photodiode, and the photoelectric element for said third light is not covered by a transparent electrode, thereby permitting at least part of incident light to permeate therethrough, being held at a predetermined voltage, and forming an electrostatic capacitance together with said body.

3. A solid-state color imaging device comprising a semiconductor body of a first conductivity type having a major surface portion and three sets of photoelectric elements disposed in said major surface portion wherein each of said sets correspond to each of a first, a second and a third primary color of light, wherein said first color of light is long wavelength light, said second color of light is middle wavelength light, and said third color of light is short wavelength light, respectively, with each photoelectric element being comprised of:

(a) a field-effect transistor having a region of a second conductivity type opposite to said first conductivity type, a gate insulating film provided so as to cover a region adjacent to the region of the second conductivity type, a gate electrode provided on said gate insulating film, and a photo-sensitive region adjacent to said region covered with said gate insulating film; and (b) a transparent electrode which is provided on said insulating film and which permits at least part of the incident light to permeate therethrough, said transparent electrode being held at a predetermined voltage and forming a depletion layer in said photosensitive region, said transparent electrode and said photosensitive region forming an electrostatic capacitance, said depletion layer functioning as the field-effect transistor together with said region having the second conductivity type and said gate electrode, and wherein the gate electrode of the photoelectric element for said first light covers over its respective photodiode, the gate electrode of the photoelectric element for said second light covers part of its respective photodiode, and the photoelectric element for said third light is not covered by a gate electrode.

4. A solid-state color imaging device comprising a semiconductor body of a first conductivity type having a major surface portion wherein there are three sets of photoelectric elements for a first, a second, and a third primary color of light, wherein said first color of light is long wavelength light, said second color of light is middle wavelength light, and said third color of light is short wavelength light, respectively, disposed in said major surface portion, each of said sets corresponding to a respective color component separated by an optical filter, a respective photoelectric element being comprised of:

(a) a field-effect transistor having a source region and a drain region of a second conductivity type opposite to said first conductivity type, a gate insulating film provided so as to cover a region lying between said source region and said drain region, and a gate electrode provided on said gate insulating film, one of said source region and said drain region constituting with said substrate a photodiode;

(b) a transparent insulating film which is provided so as to cover said photodiode; and (c) a transparent electrode which is provided on said insulating film and which permits at least part of incident light to permeate therethrough, said transparent electrode being held at a predetermined voltage and forming an electrostatic capacitance together with said body wherein the transparent insulating films of said photoelectric elements for said colors have the same thickness, the transparent electrodes of said photoelectric elements for primary colors cover over the photodiodes, and the transparent electrode of the photoelectric element for said first light is thicker than that of the photoelectric element for said second light.

5. A solid-state color imaging device comprising a semiconductor body of a first conductivity type having a major surface portion and a plurality of sets of photoelectric elements disposed in said major surface portion of said body, with each set of said photoelectric elements corresponding to each of a first, a second, and a third primary color of light, wherein said first color of light is long wavelength light, said second color of light is middle wavelength light, and said third color of light is short wavelength light, respectively, with each respective photoelectric element being comprised of:

(a) a field-effect transistor having a region of a second conductivity type opposite to said first conductivity type constituting with said body a photodiode, a gate insulating film provided so as to cover a region adjacent to said region of a second conductivity type, a gate electrode provided on said gate insulating film, a region for transferring charges being adjacent to said region covered with said gate electrode, and functioning as the field-effect transistor together with said region of a second conductivity type and said gate electrode, and a transfer-electrode provided so as to cover said region for transferring charges;

(b) a transparent insulating film which is provided so as to cover said photodiode; and (c) a transparent electrode which is provided on said insulating film and which permits at least part of incident light to permeate therethrough, said transparent electrode being held at a predetermined voltage and forming an electrostatic capacitance together with said substrate wherein the transparent insulating films of said photoelectric elements for said colors have the same thickness, the transparent electrodes of said photoelectric elements for primary colors cover over their respective photodiode, and a transparent electrode of the photoelectric element for said first light is thicker than that of the photoelectric element for said second light.

6. A solid-state color imaging device comprising a semiconductor body of a first conductivity type having a major surface portion and three sets of photoelectric elements corresponding to each of a first, a second, and a third primary color of light, wherein said first color of light is long wavelength light, said second color of light is middle wavelength ight, and said third color of light is short wavelength light, respectively, disposed in said major surface portion, each photoelectric element being comprised of:

(a) a field-effect transistor having a region of a second conductivity type opposite to said first conductivity type, a gate insulating film provided so as to cover a region adjacent to the region of the second conductivity type, a gate electrode provided on said gate insulating film, and a photo-sensitive region adjacent to said region covered with said gate insulating film; and (b) a transparent electrode which is provided on said insulating film and which permits at least part of incident light to permeate therethrough, said transparent electrode being held at a predetermined voltage and forming a depletion layer in said photosensitive region, said transparent electrode and said photosensitive region forming an electrostatic capacitance, said depletion layer functioning as the field-effect transistor together with said region having the second conductivity type and said gate electrode wherein the transparent insulating films of said photoelectric elements for said colors have the same thickness, the transparent electrodes of their respective photoelectric elements for primary colors cover over said photodiodes, and the transparent electrode of the photoelectric element for said first light is thicker than that of the photoelectric element for said second light.

7. A solid-state color imaging device comprising a semiconductor body of a first conductivity type having a major surface portion and a plurality of sets of photoelectric elements disposed in said major surface portion, wherein there are three sets of said photoelectric elements for a first, a second, and a third primary color of light, wherein said first color of light is long wavelength light, said second color of light is middle wavelength light, and said third color of light is short wavelength light, respectively, each of said sets corresponding to a respective color component separated by an optical filter, a respective photoelectric element being comprised of:

(a) a field-effect transistor having a source region and a drain region of a second conductivity type opposite to said first conductivity type, a gate insulating film provided so as to cover a region lying between said source region and said drain region, and a gate electrode provided on said gate insulating film, one of said source region and said drain region constituting with said substrate a photodiode;

(b) a transparent insulating film which is provided so as to cover said photodiode; and (c) a transparent electrode which is provided on said insulating film and which permits at least part of incident light to permeate therethrough, said transparent electrode being held at a predetermined voltage and forming an electrostatic capacitance together with said body wherein said transparent electrodes of said photoelectric elements cover over said photodiodes, the transparent insulating film of the photoelectric element for said first light is thinner than that of the photoelectric element for said second light, and the transparent insulating film of the photoelectric element for said second light is thinner than that of the photoelectric element of said third light.

8. A solid-state color imaging device comprising a semiconductor body of a first conductivity type having a major surface portion and a plurality of sets of photoelectric elements, wherein there are three sets of photoelectric elements each corresponding to a first, a second, and a third primary color light, wherein said first color of light is long wavelength light, said second color of light is middle wavelength light, and said third color of light is short wavelength light, respectively, each respective photoelectric element being comprised of:

(a) a field-effect transistor having a region of a second conductivity type opposite to said first conductivity type constituting with said body a photodiode, a gate insulating film provided so as to cover a region adjacent to said region of a second conductivity type, a gate electrode provided on said gate insulating film, a region for transferring charges being adjacent to said region covered with said gate electrode, and functioning as the field-effect transistor together with said region of a second conductivity type and said gate electrode, and a transfer-electrode provided so as to cover said region for transferring charges;

(b) a transparent insulating film which is provided so as to cover said photodiode; and (c) a transparent electrode which is provided on said insulating film and which permits at least part of incident light to permeate therethrough, said transparent electrodes being held at a predetermined voltage and forming an electrostatic capacitance together with said substrate, wherein said transparent electrodes of said photoelectric elements cover over said photodiodes, the transparent insulating film of the photoelectric element for said first light is thinner than that of the photoelectric element for said second light, and the transparent insulating film of the photoelectric element for said second light is thinner than that of the photoelectric element for said third light.

9. A solid-state color imaging device comprising a semiconductor body of a first conductivity type having a major surface portion and a plurality of sets of photoelectric elements, wherein there are three sets of said photoelectric elements each corresponding to each of a first, a second, and a third primary color of light, wherein said first color of light is long wavelength light, said second color of light is middle wavelength light, and said third color of light is short wavelength light, respectively, each photoelectric element being comprised of:

(a) a field-effect transistor having a region of a second conductivity type opposite to said first conductivity type, a gate insulating film provided so as to cover a region adjacent to the region of the scond conductivity type, a gate electrode provided on said gate insulating film, and a photosensitive region adjacent to said region covered with said gate insulating film; and (b) a transparent electrode which is provided on said insulating film and which permits at least part of incident light to permeate therethrough, said transparent electrode being held at a predetermined voltage and forming a depletion layer in said photosensitive region, said transparent electrode and said photosensitive region forming an electrostatic capacitance, said depletion layer functioning as the field effect transistor together with said region having the second conductivity type and said gate electrode, wherein said transparent electrodes of said photoelectric elements cover over said photodiodes, the transparent insulating film of the photoelectric element for said first light is thinner than that of the photoelectric element for said second light, and the transparent insulating film of the photoelectric element for said second light is thinner than that of the photoelectric element for said third light.

10. A solid-state color imaging device according to claim 1, 4, or 7, wherein said transparent electrode is made of a member selected from the group consisting of a tin oxide layer, an indium oxide layer, a titanium oxide layer, a polycrystalline sillicon layer, a thin aluminum layer, a thin platinum layer, a thin palladium layer, a thin molybdenum layer, a thin indium layer, a thin chromium layer, and a thin gold layer.

11. A solid-color imaging device according to claims 2, 5, or 8, wherein said transparent electrode is made up of a member selected from the group consisting of a tin oxide layer, an indium oxide layer, a titanium oxide layer, a polycrystalline silicon layer, a thin aluminum layer, a thin platinum layer, a thin palladium layer, a thin molybdenum layer, a thin indium layer, a thin chromium layer, and a thin gold layer.

12. A solid-state color imaging device according to claims 3, 6, or 9, wherein said transparent electrode is made of a member selected from the group consisting of a tin oxide layer, an indium oxide layer, a titanium oxide layer, a polycrystalline silicon layer, a thin aluminum layer, a thin platinum layer, a thin palladium layer, a thin molybdenum layer, a thin indium layer, a thin chromium layer, and a thin gold layer.

13. A solid-state color imaging device according to claim 4, wherein the transparent electrode of both a photoelectric element for said first light and the photoelectric element for said second light are made of polycrystalline silicon.

14. A solid-state color imaging device according to claim 13, wherein the transparent electrode of the photoelectric element for said third light is made of polycrystalline silicon and is thinner than that of the photoelectric element for said second light.

15. A solid-state color imaging device according to claim 13, wherein the transparent electrode of the photoelectric element for said third light is made of a member selected from the group consisting of tin oxide, titanium oxide and indium oxide.

16. A solid-state color imaging device according to claim 5, wherein the transparent electrodes of both a photoelectric element for said first light and a photoelectric element for said second light are made of polycrystalline silicon.

17. A solid-state color imaging device according to claim 16, wherein the transparent electrode of the photoelectric element for said third light is made of polycrystalline silicon and is thinner than that of the photoelectric element for said second light.

18. A solid-state color imaging device according to claim 16, wherein the transparent electrode of the photoelectric element for said third light is made of a member selected from the group consisting of tin oxide, indium oxide and titanium oxide.

19. A solid-state color imaging device according to claim 6, wherein the transparent electrodes of both a photoelectric element for said first light and a photoelectric element for said second light are made of polycrystalline silicon.

20. A solid-state color imaging device according to claim 19, wherein the transparent electrode of the photoelectric element for said third light is made of polycrystalline silicon and is thinner than that of the photoelectric element for said second light.

21. A solid-state color imaging device according to claim 19, wherein the transparent electrode of the photoelectric element for said third light is made of a member selected from the group consisting of tin oxide, indium oxide and titanium oxide.

22. A solid-state color imaging device according to claims 1, 2, 3, 4, 5, 6, 7, 8 or 9, wherein said first color of light is red, said second color of light is green, and said third color of light is blue.

* * * * *